(12) United States Patent
Zyuban et al.

(10) Patent No.: US 11,722,060 B2
(45) Date of Patent: Aug. 8, 2023

(54) POWER CONVERTER WITH CHARGE INJECTION FROM BOOSTER RAIL

(71) Applicant: Apple Inc., Cupertino, CA (US)

(72) Inventors: Victor Zyuban, Sunnyvale, CA (US); Norman J. Rohrer, San Jose, CA (US); Shawn Searles, Austin, TX (US)

(73) Assignee: Apple Inc., Cupertino, CA (US)

( * ) Notice: Subject to any disclaimer, the term of this patent is extended or adjusted under 35 U.S.C. 154(b) by 23 days.

(21) Appl. No.: 16/936,410

(22) Filed: Jul. 22, 2020

(65) Prior Publication Data

US 2022/0029536 A1 Jan. 27, 2022

(51) Int. Cl.
*H02M 3/158* (2006.01)
*H03K 5/24* (2006.01)

(52) U.S. Cl.
CPC .............. *H02M 3/158* (2013.01); *H03K 5/24* (2013.01)

(58) Field of Classification Search
None
See application file for complete search history.

(56) References Cited

U.S. PATENT DOCUMENTS

| | | | | |
|---|---|---|---|---|
| 5,929,692 | A * | 7/1999 | Carsten | H02M 1/15 327/551 |
| 6,703,812 | B1 * | 3/2004 | Lethellier | H02M 3/1584 323/284 |
| 6,836,193 | B1 * | 12/2004 | Kim | H03B 5/00 331/177 V |
| 6,943,535 | B1 * | 9/2005 | Schiff | H02M 3/1584 323/244 |
| 9,444,340 | B2 * | 9/2016 | Tournatory | H02M 3/158 |
| 10,020,736 | B2 * | 7/2018 | Wu | H02M 3/1584 |
| 10,243,456 | B2 * | 3/2019 | Pelicia | G05F 1/565 |
| 10,425,000 | B2 | 9/2019 | Neidorff et al. | |
| 10,488,875 | B1 | 11/2019 | Olieman et al. | |
| 10,496,115 | B2 * | 12/2019 | Hung | G05F 1/462 |
| 10,511,234 | B2 | 12/2019 | Zhang et al. | |
| 10,554,124 | B1 | 2/2020 | Mangudi et al. | |
| 10,763,750 | B1 * | 9/2020 | Jovanovic | H02M 3/157 |
| 2015/0381026 | A1 * | 12/2015 | Tournatory | H02M 3/158 323/271 |
| 2017/0063239 | A1 * | 3/2017 | Wu | H02M 3/1584 |
| 2017/0085183 | A1 * | 3/2017 | Notsch | H02M 1/44 |
| 2020/0021256 | A1 * | 1/2020 | Terwal | H02M 1/083 |
| 2021/0152023 | A1 * | 5/2021 | Pearson | H02J 50/20 |

FOREIGN PATENT DOCUMENTS

WO    WO-2022096857 A1 *  5/2022  ............. G05F 1/575

* cited by examiner

*Primary Examiner* — Thomas J. Hiltunen
*Assistant Examiner* — Khareem E Almo
(74) *Attorney, Agent, or Firm* — Kowert, Hood, Munyon, Rankin & GOetzel, P.C.; Dean M. Munyon

(57) ABSTRACT

A converter circuit, included in a power converter circuit, may generate a given voltage level on a regulated power supply node of a computer system. A control circuit may monitor a voltage level and assert a control signal in response to a determination that a regulation event has occurred. A boost converter circuit, included in the power converter circuit, may inject charge into to the regulated power supply node via a capacitor, in response to an assertion of the control signal.

20 Claims, 9 Drawing Sheets

POWER CONVERTER WITH CHARGE INJECTION FROM BOOSTER RAIL

BACKGROUND

Technical Field

Embodiments described herein relate to integrated circuits, and more particularly, to techniques for generating regulated power supply voltages.

Description of the Related Art

Modern computer systems may include multiple circuits blocks designed to perform various functions. For example, such circuit blocks may include processors, processor cores configured to execute software or program instructions. Additionally, the circuit blocks may include memory circuits, mixed-signal or analog circuits, and the like.

In some computer systems, the circuit blocks may be designed to operate at different power supply voltage levels. Power management circuits may be included in such computer systems to generate and monitor varying power supply voltage levels for the different circuit blocks.

Power management circuits often include one or more power converter circuits configured to generate regulator voltage levels on respective power supply signals using a voltage level of an input power supply signal. Such regulator circuits may employ multiple passive circuit elements, such as inductors, capacitors, and the like.

SUMMARY OF THE EMBODIMENTS

Various embodiments for generating a regulated power supply voltage level are disclosed. Broadly speaking, a power converter circuit includes a first converter circuit coupled to a regulated power supply node, and may be configured to generate a given voltage on the regulated power supply node. The power converter circuit may also include a second converter circuit coupled to the regulated power supply node via a capacitor, and may be configured to source a current to the regulated power supply node in response to an assertion of a control signal. The power converter circuit may also include a control circuit configured to assert the control signal in response to a detection of a regulation event. In other embodiments, to assert the control signal, the control circuit may be further configured to monitor a voltage level of the regulated power supply node, and assert the control signal in response to a determination that the voltage level of the regulated power supply node is less than a threshold value.

BRIEF DESCRIPTION OF THE DRAWINGS

The following detailed description makes reference to the accompanying drawings, which are now briefly described.

Figure 1:
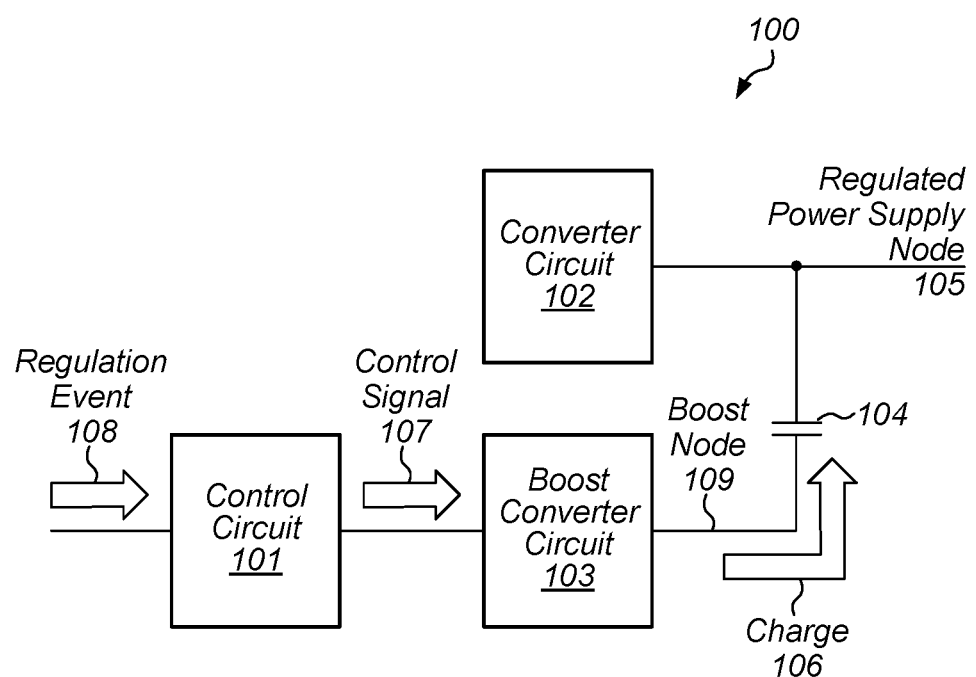
FIG. 1 is a block diagram of an embodiment of a power converter circuit.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. The phrase "based on" is thus synonymous with the phrase "based at least in part on."

DETAILED DESCRIPTION OF EMBODIMENTS

Computer systems may include multiple circuit blocks configured to perform specific functions. Such circuit blocks may be fabricated on a common substrate and may employ different power supply voltage levels. Power management units (commonly referred to as "PMUs") may include multiple power converter circuits configured to generate regulated voltage levels for various power supply signals. Such power converter circuits may employ regulator circuit that include both passive circuit elements (e.g., inductors, capacitors, etc.) as well as active circuit elements (e.g., transistors, diodes, etc.).

Different types of voltage regulator circuits may be employed based on power requirements of load circuits, available circuit area, and the like. One type of commonly used voltage regulator circuit is a buck converter circuit. Such converter circuits include multiple phase circuits coupled to a regulated power supply node via corresponding inductors. Each of the phase circuits may be periodically activated to source current to a corresponding inductor and circulate current from a ground supply node through the inductor in order to maintain a desired voltage level on the power supply node.

In some computer systems, multiple circuit blocks may be coupled to a power supply node whose voltage is regulated by a buck converter circuit. Changes in operating mode such load circuits can affect an amount of current drawn from the power supply node. When the current demand increases, the buck converter circuit compensates for the increase demand by supplying more current to the regulated power supply node. During the time it takes the buck converter circuit to increase its current output, the voltage level of the power supply node may fall or droop.

The inventors realized that relying on decoupling capacitors to minimize the drop in the voltage level of the power supply node was inadequate, and that by injecting charge into the power supply node via a capacitor coupled to a second buck converter, the voltage response of the converter system could be improved. The embodiments illustrated in the drawings and described below provide techniques for a power converter circuit to inject, during regulation events, additional charge into a regulated power supply node via a capacitor, thereby improving the voltage response of the power converter circuit.

A block diagram of an embodiment of a power converter circuit is depicted in FIG. 1 As illustrated power converter circuit 100 includes control circuit 101, converter circuit 102, and boost converter circuit 103.

Converter circuit 102 is coupled to regulated power supply node 105, and is configured to generate a given voltage level on regulated power supply node 105. As described below in more detail, converter circuit 102 may include multiple phase circuits coupled by respective ones of multiple inductors to regulated power supply node 105.

Boost converter circuit 103 is coupled to regulated power supply node 105 via capacitor 104. In various embodiments, boost converter circuit 103 is configured to inject charge 106 to regulated power supply node 105, in response to an assertion of control signal 107. The injection of charge 106 into regulated power supply node 105 can, in some cases, reduce a drop in a voltage level of regulated power supply node 105 during periods for which there is an increased demand for current from one or more load circuits coupled to regulated power supply node 105. As used and described herein, "assertion" of a signal refers to changing a logical value of the signal from a value associated with an inactive state of a particular operation, to a different value associated with an active state of the particular operation. For example, in one embodiment, an assertion of control signal 107 includes changing control signal 107 from a logic-0 value to a logic-1 value.

Control circuit 101 is configured to assert control signal 107 in response to a detection of regulation event 108, which is associated with regulated power supply node 105. As used and defined herein, a "regulation event" is change in at least one operation condition associated with one or more circuits coupled to a regulated power supply node that results in a change in load current to be supplied by a power converter circuit coupled to the regulated power supply node. For example, a regulation event may include a detection that a voltage level of the regulated power supply node has dropped below a threshold value, or a detection of an increase in activity of a one or more load circuits. As described below, control circuit 101 may be configured to detect different types of regulation events and assert control signal 107 in response to such events, or any suitable combination of events.

Figure 2:
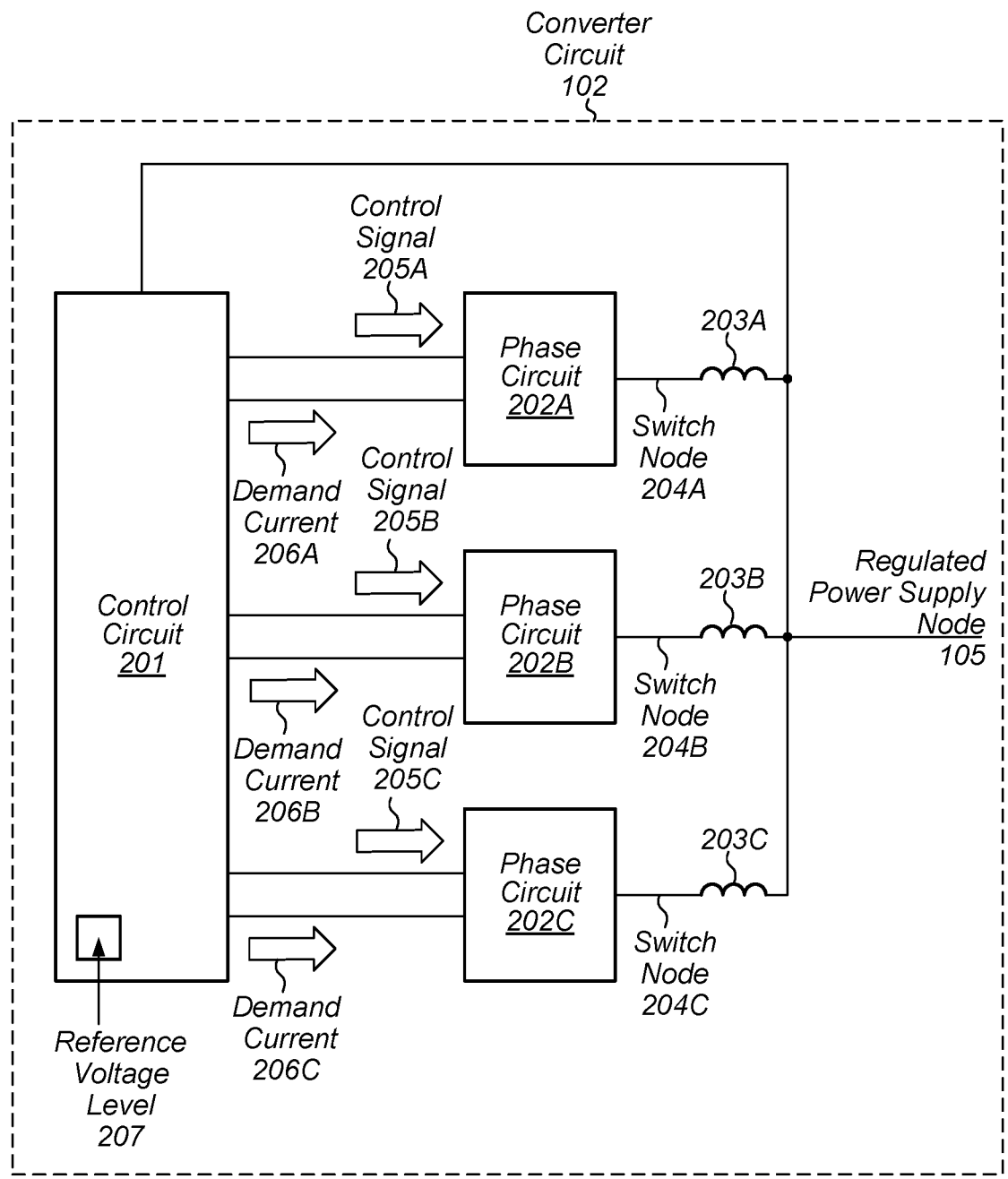
FIG. 2 is a block diagram of an embodiment of a converter circuit used in a power converter circuit.

A block diagram depicting an embodiment of converter circuit 102 is depicted in FIG. 2. As illustrated, converter circuit 102 includes control circuit 201, phase circuits 202A-202C, and inductors 203A-203C.

Phase circuit 202A is coupled to regulated power supply node 105 via switch node 204A and inductor 203A. In a similar fashion, phase circuits 202B and 202C are coupled to regulated power supply node 105 via switch nodes 204B and 204C, and inductors 203B and 204C, respectively. As described below in more detail, phase circuits 202A-202C are configured to source respective currents to regulated power supply node 105 based, at least in part, on the values of control signals 205A-205C and demand currents 206A-206C. Although three phase circuits are depicted in the embodiment of FIG. 2, in other embodiments, any suitable number of phase circuits may be employed.

In various embodiments, inductors 203A-203C may be fabricated on a common integrated circuit with phase circuits 202A-202C and control circuit 201. In other cases, inductors 203A-203C may be fabricated on a different integrated circuit than phase circuits 202A-202C and control circuit 201. In such cases, an integrated circuit including inductors 203A-203C and an integrated circuit including phase circuits 202A-202C and control circuit 210 may be mounted in a common package, or mounted on a common circuit board or other suitable substrate.

Control circuit 201 is configured to generate demand currents 206A-206B using reference voltage level 207 and a voltage level of regulated power supply node 105. supply node 105C. Control circuit 201 is further configured to generate control signals 205A-205C. In various embodiments, control signals 205A-205C may be based, at least in part, on a clock or other timing signal (not shown). In various embodiments, control circuit 201 may include any suitable combination of analog circuits (e.g., comparator circuits), combinatorial logic circuits, and sequential logic circuits.

Figure 3:
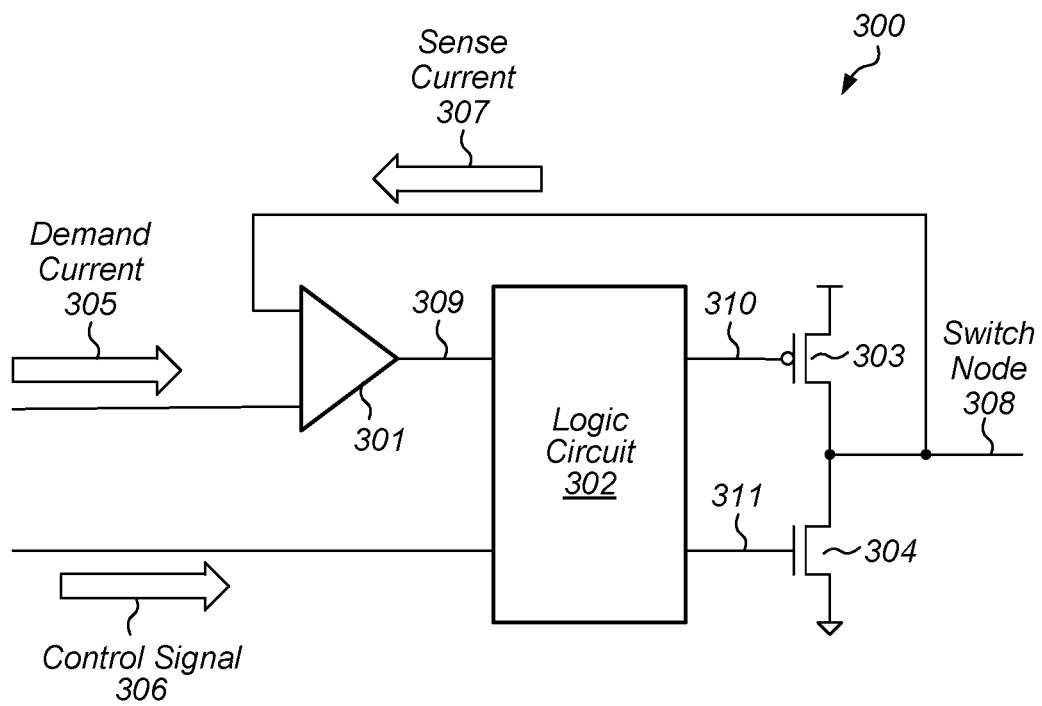
FIG. 3 is a block diagram of an embodiment of a phase circuit.

Phase circuits, such as those depicted in the embodiment of FIG. 2, may be designed according to various design styles. A particular embodiment of a phase circuit is depicted in FIG. 3. It is noted that phase circuit 300 may correspond to any of phase circuits 202A-202C as depicted in FIG. 1. As illustrated, phase circuit 300 includes comparator circuit 301, logic circuit 302, and devices 303 and 304. Device 303 is coupled between an input power supply node and switch node 308, while device 304 is coupled between switch node 308 and a ground supply node. It is noted that in various embodiments, switch node 308 may be coupled to any of inductors 203A-203C.

Device 303 may be a particular embodiment a p-channel metal-oxide semiconductor field-effect transistor (MOSFET) configured to source current to regulated power supply node 105 via switch node 308. Device 304 may be a particular embodiment of an n-channel MOSFET configured to circulate current from a ground supply node to regulated power supply node 105 via switch node 308. In various embodiments, a voltage level of node 310 may activate device 303, while a voltage level of node 311 may activate device 304.

Logic circuit 302 using control signal 306 and a voltage level of node 309 is configured to determine the voltage levels of nodes 310 and 311. In various embodiments, an assertion of control signal 306 may result in a voltage level on node 310 sufficient to activate device 303, thereby allowing current to flow into switch node 308. It is noted that control signal 306 may be generated by a control or other circuit coupled to power converter circuit 100. In some cases, each of phase circuits 202A-202C may have separate control signals, while in other embodiments, each of phase circuits 202A-202C may share a common control signal. The type of control signal arrangement may be based, at least in part, on the selected operating mode of power converter circuit 100.

The current flowing into switch node 308 is sensed, generating sense current 307. Comparator circuit 301 is configured to generate a voltage level on node 309 that is based, at least in part, on a difference between sense current 307 and demand current 305. In various embodiments, demand current 305 may correspond, based on a selection of an operating mode of power converter circuit 100, to any of demand currents 206A-206C or to a common demand current. For example, demand current 305 may correspond to any of demand currents 206A-206C when power converter circuit 100 is operating in a multi-phase mode. Alternatively, demand current 305 may correspond to a common demand current when power converter circuit 100 is operating in a single-phase mode.

Logic circuit 302 may be further configured, in response to an increase in a voltage level of node 309, to increase the voltage level of node 310 to deactivate device 303, and increase the voltage level of node 311 to activate device 304, thereby circulating a current from a ground supply node to switch node 308. In this type of regulation, the duration of time that phase circuit 300 is sourcing current to switch node 308 is variable based on a difference between demand current 305 and sense current 307. The duration of time that phase circuit 300 is circulating current from the ground supply node to switch node 308 is fixed and determined by a frequency of control signal 306.

It is noted that the embodiment of phase circuit 300 depicted in FIG. 3 is an example of a possible implementation of a phase circuit that uses a particular mechanism for regulation of the voltage level on regulated power supply node 105. In other embodiments, phase circuit 300 may employ a fixed charging time determined by control signal 306 or other suitable timing signal, and the time during which current is circulated from the ground supply node to switch node 308 may be determined using sense current 307 and demand current 305.

Figure 4:
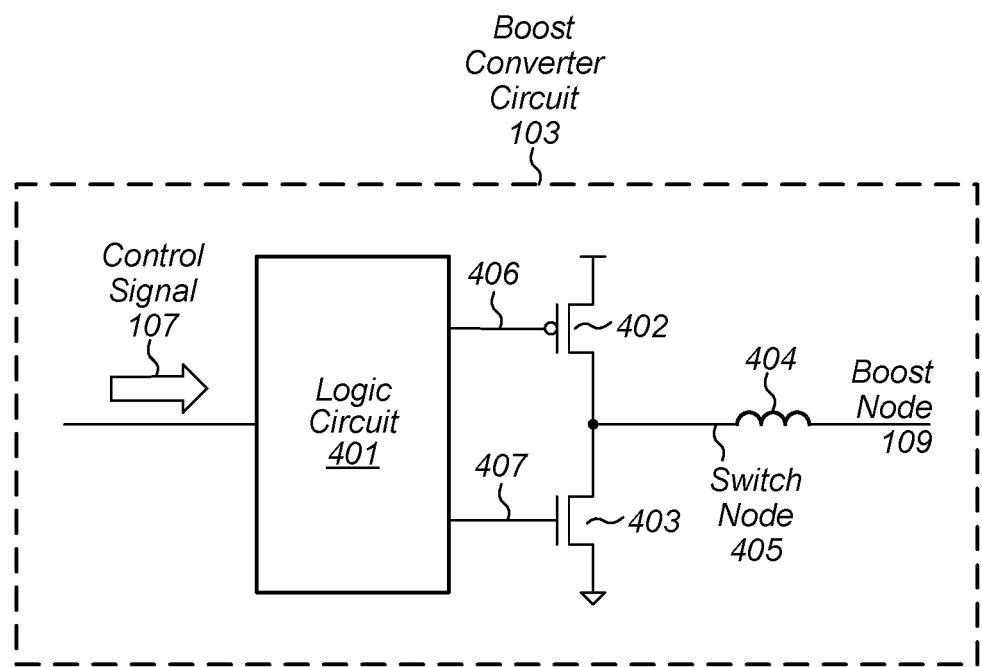
FIG. 4 is a block diagram of an embodiment of a boost converter circuit.

Turning to FIG. 4, a block diagram of an embodiment of boost converter circuit 103 is depicted. As illustrated, boost converter circuit 103 includes logic circuit 401, device 402, device 403, and inductor 404. Device 402 is coupled between an input power supply node and switch node 405, while device 403 is coupled between switch node 405 and a ground supply node. Switch node 405 is coupled to boost node 109 via inductor 404. It is noted that a value of inductor 404 may be less than the respective values of inductors 203A-C. In some cases, the value of inductor 404 may be small (e.g., on the order of 10 pH). In other cases, inductor 404 may be omitted as the parasitic inductance associated with the wiring of boost node 106 may be sufficient for the operation of boost converter circuit 103.

Device 402 may be a particular embodiment a p-channel metal-oxide semiconductor field-effect transistor (MOSFET) configured to source current to boost node 109 via switch node 405 and inductor 404 in order to charge capacitor 104. It is noted that in some embodiments, the voltage level boost node 109 is greater than a voltage level regulated power supply node 105, to increase an amount of charge 106 injected into regulated power supply node 105. Device 403 may be a particular embodiment of an n-channel MOSFET configured to circulate current from a ground supply node to boost node 109 via switch node 405 and inductor 404. In various embodiments, a voltage level of node 406 may activate device 402, while a voltage level of node 407 may activate device 403.

Logic circuit 401, which may be a particular embodiment of a sequential logic circuit, state machine, or any other suitable combinatorial logic circuit, is configured to determine the voltage levels of nodes 406 and 407 using control signal 107. In various embodiments, an assertion of control signal 107 may result in a voltage level on node 406 sufficient to activate device 402, thereby allowing current to flow into switch node 405. As noted above, control signal 107 may be asserted in response to a detection of a regulation event associated with regulated power supply node 105.

In response to a de-assertion of control signal 107, which may correspond to a detection that the regulation event has ended, logic circuit 401 may be configured to increase the voltage level of node 406 to deactivate device 402, and increase the voltage level of node 407 to activate device 403, thereby sinking a current from switch node 408, discharging boost node 109. In some cases, the de-assertion of control signal 107 may be delayed from the detection of the end of the regulation event to allow the current to build in inductors 203A-C. In various embodiments, once boost node 109 has been discharged, a bleeder device (not shown) may be activated to maintain the boost node 109 at a standby voltage level before the next regulation event. In some cases, boost node 109 may be discharged to a voltage level that less than ground potential. In various embodiments, a circuit external the power converter 100 may generate the voltage level that is less than ground potential. By pre-charging boost node 109 to such a voltage level during a standby state, additional charge may be injected into regulated power supply node 105 via capacitor 104 during the regulation event.

Figure 5:
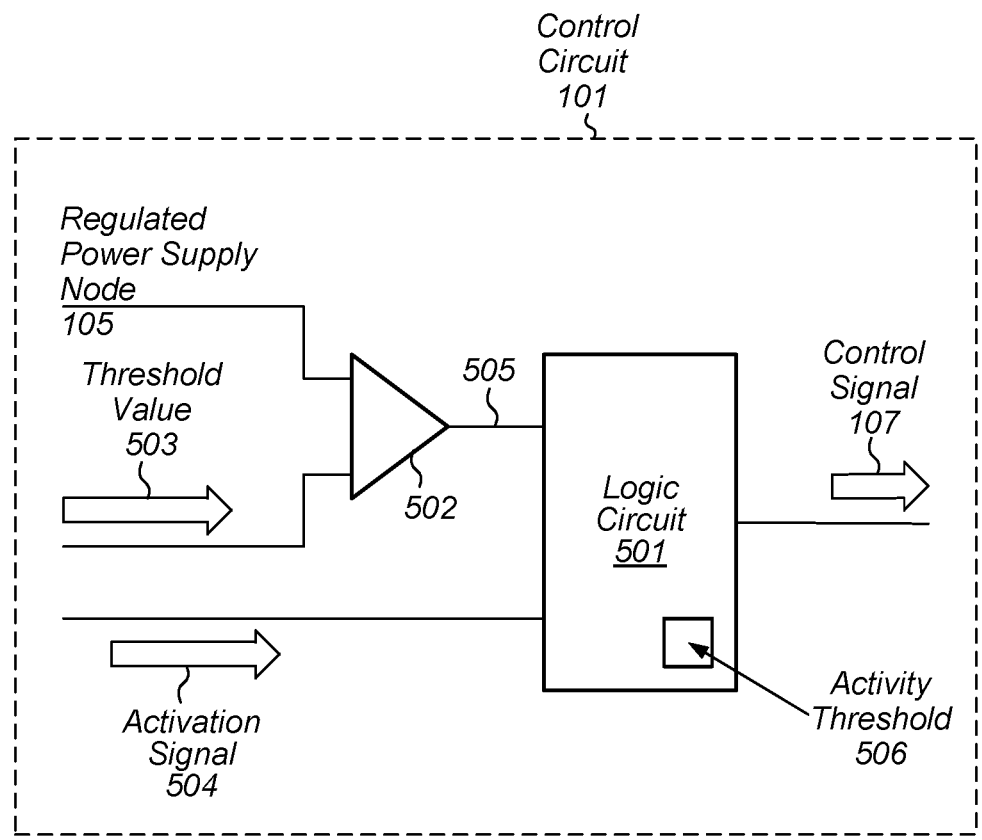
FIG. 5 is a block diagram of a control circuit.

A block diagram of an embodiment of control circuit 101 is depicted in FIG. 5. As illustrated, control circuit 101 includes logic circuit 501, and comparator circuit 502.

Comparator circuit 502 is configured to compare a voltage level of regulated power supply node 105 to threshold value 503. In various embodiments, comparator circuit 502 may include a differential amplifier circuits, or any other suitable circuit configured to compare two voltage levels. Comparator circuit may be further configured to change a voltage level of node 505 based, at least in part, on results of comparing the voltage level of regulated power supply node 105 and threshold value 503. In some cases, the voltage levels of node 505 may correspond to logic level, where one logic level indicates that the voltage level of regulated power supply node 105 is less than threshold value 503, and another logic level indicates that the voltage level of regulated power supply node 105 is greater than threshold value 503. It is noted that in some embodiments, threshold value 503 may be programmable based on temperature, a tolerance of a load circuit to changes in power supply voltage, or any other suitable metric.

Logic circuit 501 is configured to generate control signal 107 using activation signal 504 and the voltage level of node

505. In various embodiments, logic circuit 501 may assert control signal 107 in response to the voltage level of node 505 indicating that the voltage level of regulated power supply node 105 is less than threshold value 503. Logic circuit 501 may be further configured to de-assert control signal 107, in response to the voltage level of node 505 indicating that the voltage level of regulated power supply node 105 is greater than threshold value 503.

Logic circuit 501 may be further configured to assert control signal 107 in response to an assertion of activation signal 504, as well as de-assert control signal 107, in response to a de-assertion of activation signal 504. In various embodiments, activation signal may be generated by a load circuit, in response to a determination that an increase in activity has started or is anticipated. Alternatively, activation signal 504 may include information indicative of a level of activity of the load circuit. In such cases, logic circuit 501 may be configured to compare the information indicative of the level of activity of the load circuit to activity threshold 506.

In various embodiments, logic circuit 501 may include combinatorial logic circuits, a state machine or other sequential logic circuit, or any suitable combination thereof. Logic circuit 501 may, in some cases, be a general-purpose processor or controller configured to execute software or program instructions.

Figure 6:
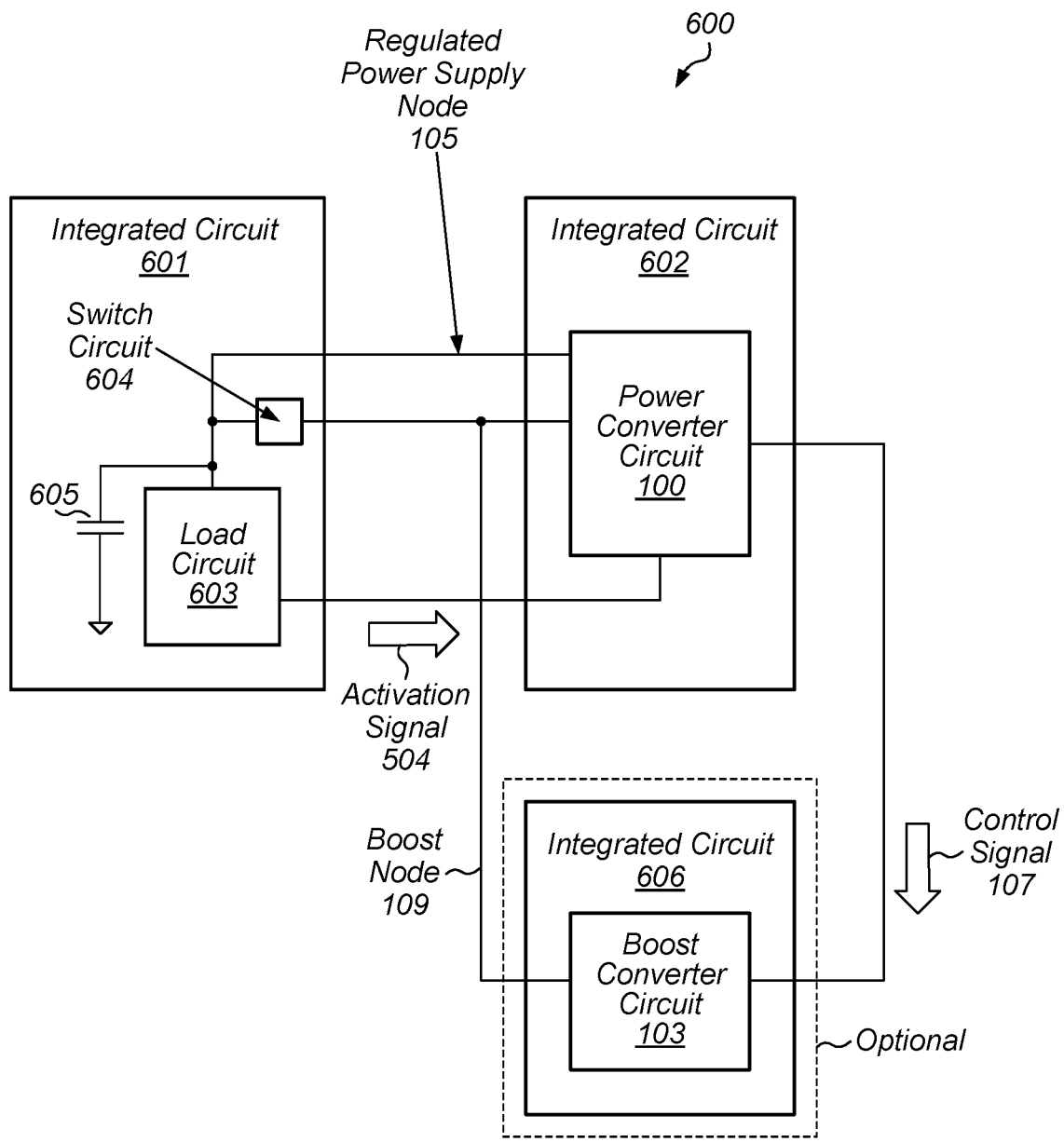
FIG. 6 is a block diagram of an embodiment of a computer system that includes multiple integrated circuits.

Turning to FIG. 6, a block diagram of a computer system is depicted. As illustrated, computer system 600 includes integrated circuits 601 and 602 (and optionally integrated circuit 606). In various embodiments, integrated circuits 601, 602, and 603 may be included in a common package, mounted together on a common substrate, or any other suitable arrangement.

Integrated circuit 601 includes load circuit 603, switch circuit 604, and capacitor 605. Load circuit 603 is coupled to regulated power supply node 105, as is capacitor 605 and switch circuit 604. In various embodiments, load circuit 603 may be configured to generate activation signal 504.

As described below in more detail, switch circuit 604 may include multiple capacitors and switches, and may be configured to adjust an amount of capacitance between boost node 109 and regulated power supply node 105. In various embodiments, capacitor 605 may be fabricated along with other circuits included in integrated circuit 601, or may be included in another integrated circuit separate from integrated circuit 601 that includes multiple passive circuit elements.

In various embodiments, integrated circuit 602, which includes power converter circuit 100, may be particular embodiment of a power management circuit configured to generate one or more regulated voltage levels, adjust the one or more regulated voltage levels based, at least in part, on changes in operating conditions of load circuits, temperature of the computer system, other any other suitable metric.

As described above, computer system 600 may optionally include integrated circuit 606. In such cases, boost converter circuit 103 may be included in integrated circuit 606, while the remaining portions of power converter circuit (e.g., converter circuit 102, control circuit 101, etc.) remain located on integrated circuit 602. By including boost converter circuit 103 in a different integrated circuit, functionality of older power management circuits may be extended without re-design. In embodiments where boost converter circuit 103 is included in a separate integrated circuit, control signal 107 may be routed between integrated circuits 602 and 606. In some cases, the circuits to generate control signal 107 may also be included in integrated circuit 606.

Figure 7:
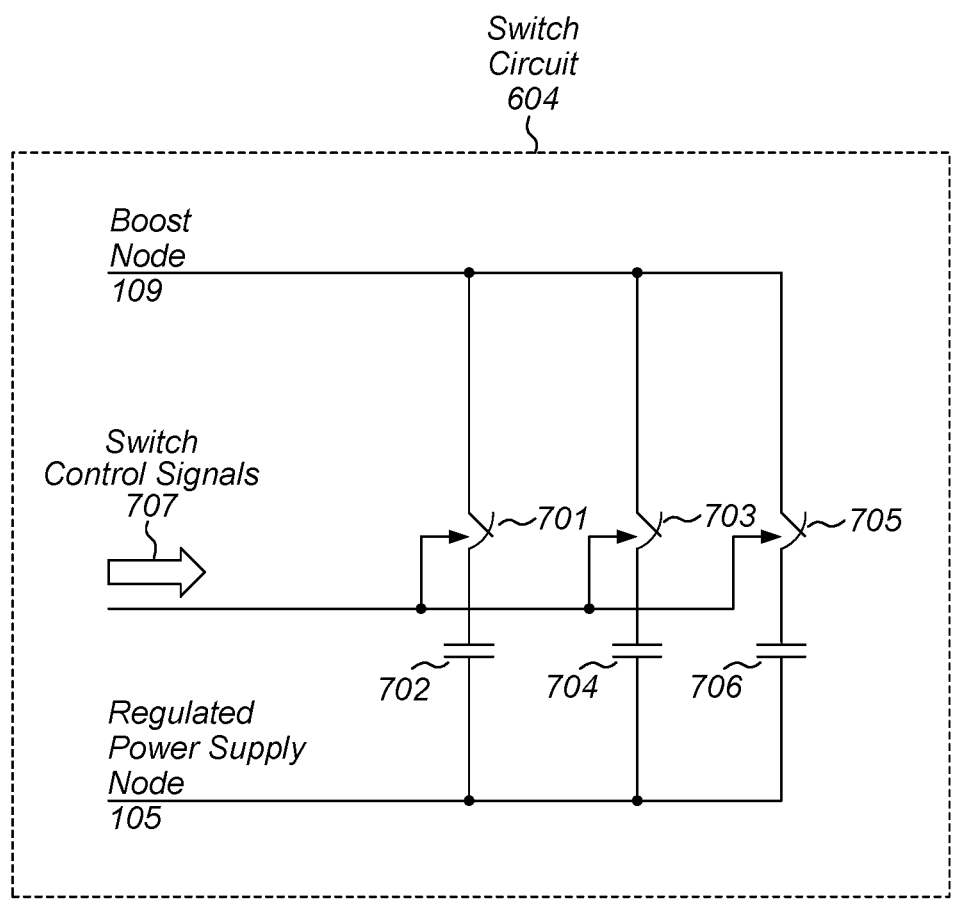
FIG. 7 is a block diagram of an embodiment of a switch circuit.

As noted above, boost node 109 may be coupled to regulated power supply node 105 by multiple capacitors included in a switch. In some cases, different numbers of capacitors may be employed in order to adjust an amount of charge injected into regulated power supply node 105 when boost converter circuit 103 is active. A block diagram of an embodiment of switch circuit 604 is depicted in FIG. 7. As illustrated, switch circuit 604 includes switches 701, 703, and 705, and capacitors 702, 704, and 706.

Switches 701, 703, and 705 are coupled between boost node 109 and a corresponding one of capacitors 702, 704, and 706, which are coupled to regulated power supply node 105. Switches 701, 703, and 705 are controlled by switch control signals 707. In some embodiments, a given one of switches 701, 703, and 705 may be controlled by a corresponding one of switch control signals 707. In other embodiments, a particular one of switches 701, 703, and 705 may be controlled by multiple ones of switch control signals 707.

Switches 701, 703, and 705 may, in various embodiments, includes multiple MOSFETs or other suitable transconductance devices. For example, a given one of switches 701, 703, and 705 may be implemented using a p-channel MOSFET and an n-channel MOSFET coupled together to form a pass gate.

Capacitors 702, 704, and 706 may be particular embodiments of metal-oxide-metal (MOM) capacitors or any other suitable capacitor structures available on a semiconductor manufacturing process. Alternatively, capacitors 702, 704, and 706 may be discrete chip capacitor affixed to integrated circuit 601 using solder bumps or other suitable technology.

Figure 8:
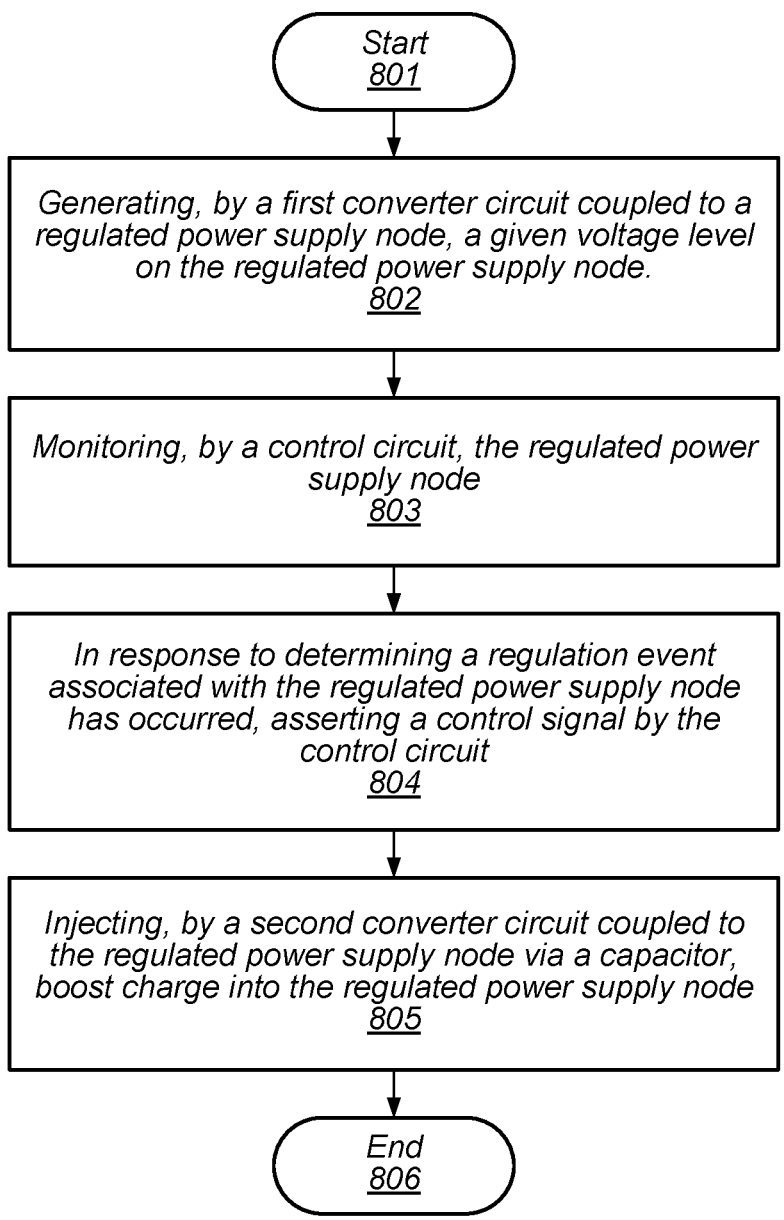
FIG. 8 depicts a flow diagram illustrating an embodiment of a method for operating a power converter circuit.

Turning to FIG. 8, a flow diagram depicting an embodiment of a method for injecting boost charge into a power supply node is illustrated. The method, which begins in block 801, may be applied to various power converter circuits, such as power converter circuit 100 as illustrated in FIG. 1.

The method includes generating, by a first power converter circuit coupled to a regulated power supply node, a given voltage level on the regulated power supply node (block 802). In some cases, the first power converter circuit may include a plurality of phase circuits, and generating, by the first power converter circuit, the given voltage level on the regulated power supply node includes sourcing, by the plurality of phase circuits, respective charge currents during respective charge time periods. Generating the given voltage level on the regulated power supply may also include, in some embodiments, sinking, by the plurality of phase circuits, respective discharge currents from the regulated power supply node during respective discharge periods.

The method further includes monitoring, by a control circuit, the regulated power supply node (block 803). In various embodiments, monitoring the regulated power supply node may include comparing, by the control circuit, a voltage level of the regulated power supply node to a threshold value. In other embodiments, the method may also include monitoring, by the control circuit, a level of activity of at least one load circuit coupled to the regulated power supply node.

The method also includes, in response to determining a regulation even associated with the regulated power supply node has occurred, asserting a control signal by the control circuit (block 804). In some embodiments, asserting the control signal may include asserting the control signal in response to determining that the voltage level of the regulated power supply node is less than the threshold value. In other embodiments, asserting the control circuit may include asserting the control signal in response to determining that the level of activity of the at least one load circuit is greater than an activity threshold value.

The method further includes injecting, by a second converter circuit coupled to the regulated power supply node via a capacitor, boost charge into the regulated power supply node (block 805). In various embodiments, the method may also include halting the injecting of the boost charge, in response to determining the regulation even has ended. The method concludes in block 806.

Figure 9:
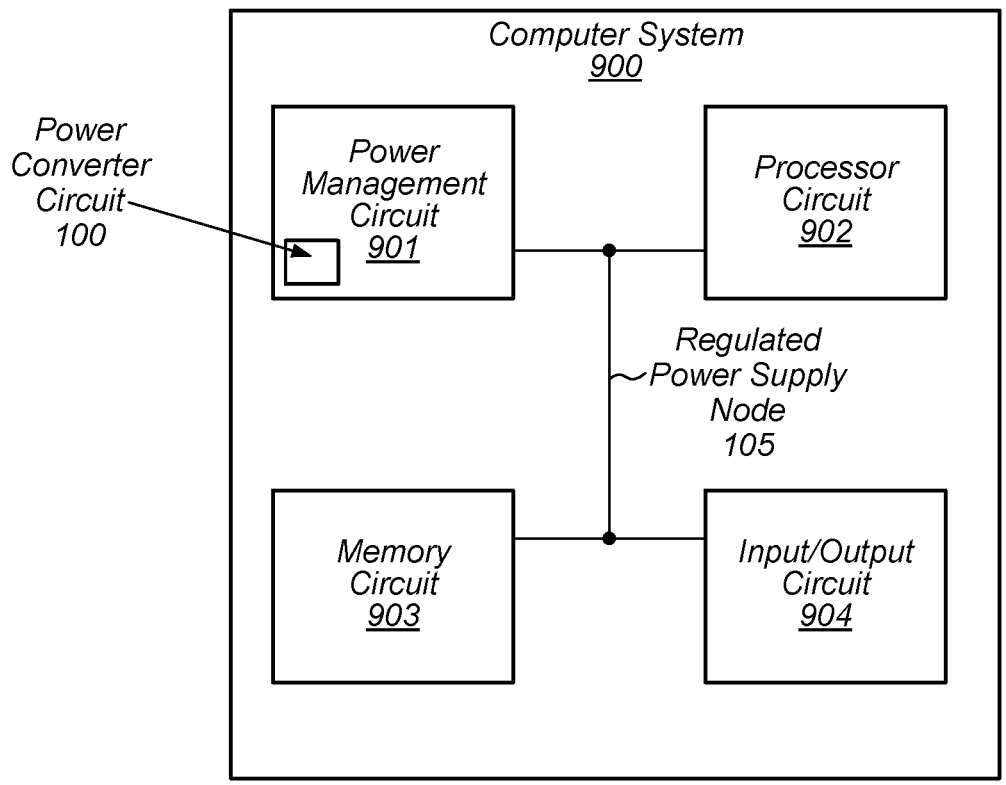
FIG. 9 illustrates a block diagram of a computer system.

A block diagram of computer system is illustrated in FIG. 9. In the illustrated embodiment, the computer system 900 includes power management circuit 901, processor circuit 902, memory circuit 903, and input/output circuits 904, each of which is coupled to regulated power supply node 105. It is noted that processor circuit 902, memory circuit 903, and input/output circuits 904 may be referred to as "load circuits" that are coupled to a regulated power supply node 105. In various embodiments, computer system 900 may be a system-on-a-chip (SoC) and/or be configured for use in a desktop computer, server, or in a mobile computing application such as, e.g., a tablet, laptop computer, or wearable computing device.

Power management circuit 901 includes power converter circuit 100 which is configured to generate a regulated voltage level on regulated power supply node 105 in order to provide power to processor circuit 902, memory circuit 903, and input/output circuits 904. Although power management circuit 901 is depicted as including a single power converter circuit, in other embodiments, any suitable number of power converter circuits may be included in power management circuit 901, each configured to generate a regulated voltage level on a respective one of multiple internal power supply signals included in computer system 900.

Processor circuit 902 may, in various embodiments, be representative of a general-purpose processor that performs computational operations. For example, processor circuit 902 may be a central processing unit (CPU) such as a microprocessor, a microcontroller, an application-specific integrated circuit (ASIC), or a field-programmable gate array (FPGA).

Memory circuit 903 may in various embodiments, include any suitable type of memory such as a Dynamic Random-Access Memory (DRAM), a Static Random-Access Memory (SRAM), a Read-Only Memory (ROM), Electrically Erasable Programmable Read-only Memory (EEPROM), or a non-volatile memory, for example. It is noted that although in a single memory circuit is illustrated in FIG. 9, in other embodiments, any suitable number of memory circuits may be employed.

Input/output circuits 904 may be configured to coordinate data transfer between computer system 900 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 904 may be configured to implement a version of Universal Serial Bus (USB) protocol or IEEE 1394 (Firewire®) protocol.

Input/output circuits 904 may also be configured to coordinate data transfer between computer system 900 and one or more devices (e.g., other computing systems or integrated circuits) coupled to computer system 900 via a network. In one embodiment, input/output circuits 904 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 904 may be configured to implement multiple discrete network interface ports.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
a first power converter circuit coupled to a regulated power supply node, wherein the first power converter circuit is configured to generate a given voltage level on the regulated power supply node using a voltage level of an input power supply node and a reference voltage, wherein the voltage level of the input power supply node is positive relative to a ground reference;
a second power converter circuit that includes an inductor connected, in series via a boost node, to a capacitor, wherein the capacitor is coupled to the regulated power supply node, and wherein the second power converter circuit is configured to:
couple a terminal of the inductor to the input power supply node to source current from the input power supply node to the regulated power supply node for a first duration during which a control signal is asserted; and
pre-charge, for a second duration during which the control signal is de-asserted, the boost node to voltage level that is negative relative to the ground reference;
a load circuit coupled to the regulated power supply node, wherein the load circuit is configured to generate an activation signal in anticipation of an increase in a level of activity of the load circuit, wherein the activation signal includes information indicative of an anticipated level of activity; and
a control circuit configured to:
receive the activation signal from the load circuit; and
assert the control signal in response to a determination that the anticipated level of activity is greater than an activity threshold.

2. The apparatus of claim 1, wherein the control circuit is further configured to:
monitor a voltage level of the regulated power supply node; and assert the control signal in response to a determination that the voltage level of the regulated power supply node is less than a threshold value.

3. The apparatus of claim 1, wherein the control circuit is further configured to de-assert the control signal in response to a determination that the activation signal has been de-asserted.

4. The apparatus of claim 1, wherein the first power converter circuit includes a plurality of phase circuits coupled to the regulated power supply node via respective ones of a plurality of inductors, and wherein the plurality of phase circuits are configured to source respective currents to the regulated power supply node via the respective ones of the plurality of inductors.

5. The apparatus of claim 1, wherein the load circuit is a component of a system-on-a-chip (SoC).

6. The apparatus of claim 1, wherein the first power converter circuit is included on a first integrated circuit, wherein the load circuit is included on a second integrated circuit, and wherein the second power converter circuit is included on a third integrated circuit.

7. The apparatus of claim 6, wherein the second integrated circuit further includes a switch circuit that includes a plurality of capacitors coupled to the regulated power supply node and corresponding ones of a plurality of switches configured to couple, based on a plurality of switch control signals, respective ones of the plurality of capacitors to the boost node to adjust an amount of capacitance between the regulated power supply node and the boost node.

8. A method, comprising:
generating, by a first converter circuit coupled to a regulated power supply node, a given voltage level on the regulated power supply node using a voltage level of an input power supply node that is positive relative to a ground reference;
asserting, by a load circuit coupled to the regulated power supply node, an activation signal in response to determining a level of activity of the load circuit is increasing, wherein the activation signal include information indicative of the level of activity of the load circuit;
in response to determining that the level of activity is greater than an activity threshold, asserting a control signal by a control circuit; and
coupling, by a second converter circuit for a first duration that the activation signal is asserted, a terminal of an inductor included in the second converter circuit to the input power supply node, wherein the inductor is connected, in series via a boost node to a capacitor coupled to the regulated power supply node;
sourcing, by the second converter circuit for the first duration, current from the input power supply node to the regulated power supply node via the inductor; and
pre-charging, by the second converter circuit for a second duration during which the control signal is de-asserted, the boost node to a pre-charge voltage level that is negative relative to the ground reference.

9. The method of claim 8, wherein the load circuit is a component of a system-on-a-chip (SoC).

10. The method of claim 8, further comprising monitoring, by the control circuit, the regulated power supply node by comparing a voltage level of the regulated power supply node to a threshold value.

11. The method of claim 10, further comprising asserting the control signal in response to determining that the voltage level of the regulated power supply node is less than the threshold value.

12. The method of claim 8, wherein the first converter circuit includes a plurality of phase circuits, and wherein generating, by the first converter circuit, the given voltage level on the regulated power supply node includes sourcing, by the plurality of phase circuits, respective charge currents during respective charge time periods.

13. The method of claim 12, wherein generating, by the first converter circuit, the given voltage level on the regulated power supply node includes circulating, by the plurality of phase circuits, respective discharge currents from the regulated power supply node during respective discharge time periods.

14. An apparatus, comprising:
a primary power converter circuit coupled to a regulated power supply node, wherein the primary power converter circuit is configured to generate a given voltage level on the regulated power supply node using a voltage level of an input power supply node and a reference voltage;
a boost power converter circuit that includes an inductor connected, in series via a boost node, to a capacitor, wherein the capacitor is coupled to the regulated power supply node, and wherein the boost power converter circuit is configured to couple a terminal of the inductor to the input power supply node to source current from the input power supply node to the regulated power supply node in response to an assertion of a control signal;
a load circuit coupled to the regulated power supply node, wherein the load circuit is configured to assert a digital activation signal in anticipation of an increase in a level of activity, wherein the digital activation signal includes information indicative of an anticipated level of activity; and
a control circuit configured to:
receive the digital activation signal from the load circuit; and
assert the control signal in response to a determination that the anticipated level of activity is greater than an activity threshold.

15. The apparatus of claim 14, wherein the primary power converter circuit is further configured to:
perform a comparison of a voltage level of the regulated power supply node to a threshold value; and
generate the control signal using a result of the comparison.

16. The apparatus of claim 14, wherein the control circuit is further configured to:
perform a comparison of a voltage level of the regulated power supply node to a threshold value; and
generate the control signal using a result of the comparison.

17. The apparatus of claim 14, wherein the boost power converter circuit is further configured to pre-charge the boost node to a voltage level that is negative relative to a ground reference for a duration the control signal is de-asserted.

18. The apparatus of claim 14, wherein the load circuit includes a microprocessor circuit.

19. The apparatus of claim 14, wherein the load circuit includes a memory circuit.

20. The apparatus of claim 14, wherein the load circuit is a component of a system-on-a-chip (SoC).

* * * * *